(12) United States Patent
Isvan

(10) Patent No.: US 7,349,547 B1
(45) Date of Patent: Mar. 25, 2008

(54) NOISE MASKING COMMUNICATIONS APPARATUS

(75) Inventor: Osman K. Isvan, Aptos, CA (US)

(73) Assignee: Plantronics, Inc., Santa Cruz, CA (US)

( * ) Notice: Subject to any disclaimer, the term of this patent is extended or adjusted under 35 U.S.C. 154(b) by 609 days.

(21) Appl. No.: 09/990,097

(22) Filed: Nov. 20, 2001

(51) Int. Cl.
*H03G 3/00* (2006.01)

(52) U.S. Cl. .................. 381/104; 379/430; 381/122

(58) Field of Classification Search ........ 381/104–109, 381/74, 376, 91, 362, 14–16, 18, 21, 23, 381/26, 337–338, 102, 58, 60, 121–122, 381/62–65; 181/20, 22; 379/430; 455/570, 455/575.2, 575.4, 569
See application file for complete search history.

(56) References Cited

U.S. PATENT DOCUMENTS

| | | | | |
|---|---|---|---|---|
| 2,485,405 A | * | 10/1949 | Olney et al. ................. | 379/430 |
| 4,020,297 A | * | 4/1977 | Brodie ........................ | 379/430 |
| 5,276,916 A | * | 1/1994 | Pawlish et al. ........... | 455/575.1 |
| 5,359,157 A | * | 10/1994 | Liu .............................. | 181/129 |
| 5,761,298 A | * | 6/1998 | Davis et al. ................. | 379/430 |
| 6,643,528 B1 | * | 11/2003 | Shim et al. ............... | 455/575.2 |
| 6,768,804 B1 | * | 7/2004 | Isvan ......................... | 381/376 |
| 6,778,676 B2 | * | 8/2004 | Groth et al. ................ | 381/382 |
| 2002/0098877 A1 | * | 7/2002 | Glezerman .................. | 455/568 |
| 2003/0003969 A1 | * | 1/2003 | Tong et al. .................. | 455/568 |

FOREIGN PATENT DOCUMENTS

JP 11308314 * 5/1999

* cited by examiner

*Primary Examiner*—Vivian Chin
*Assistant Examiner*—Lun-See Lao
(74) *Attorney, Agent, or Firm*—MacPherson, Kwok, Chen & Heid LLP

(57) ABSTRACT

A communications headset with a movable microphone boom that extends to different distances from the mouth, where the movement of the boom operates electrical, mechanical or acoustic means to adjust the transmit and/or receive sensitivity of the headset.

43 Claims, 11 Drawing Sheets

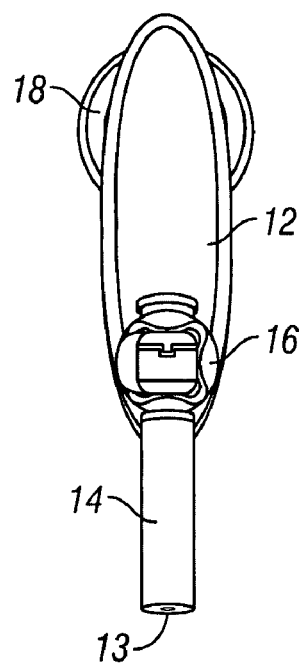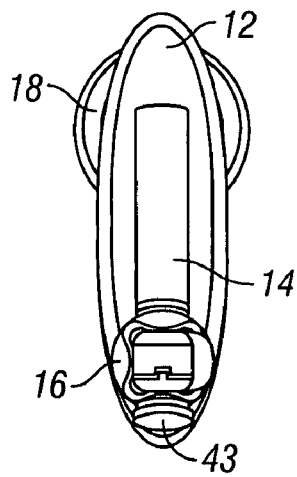
FIG. 4A
FIG. 4B
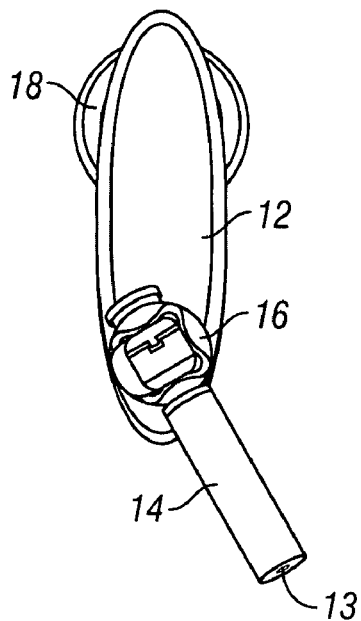
FIG. 4C

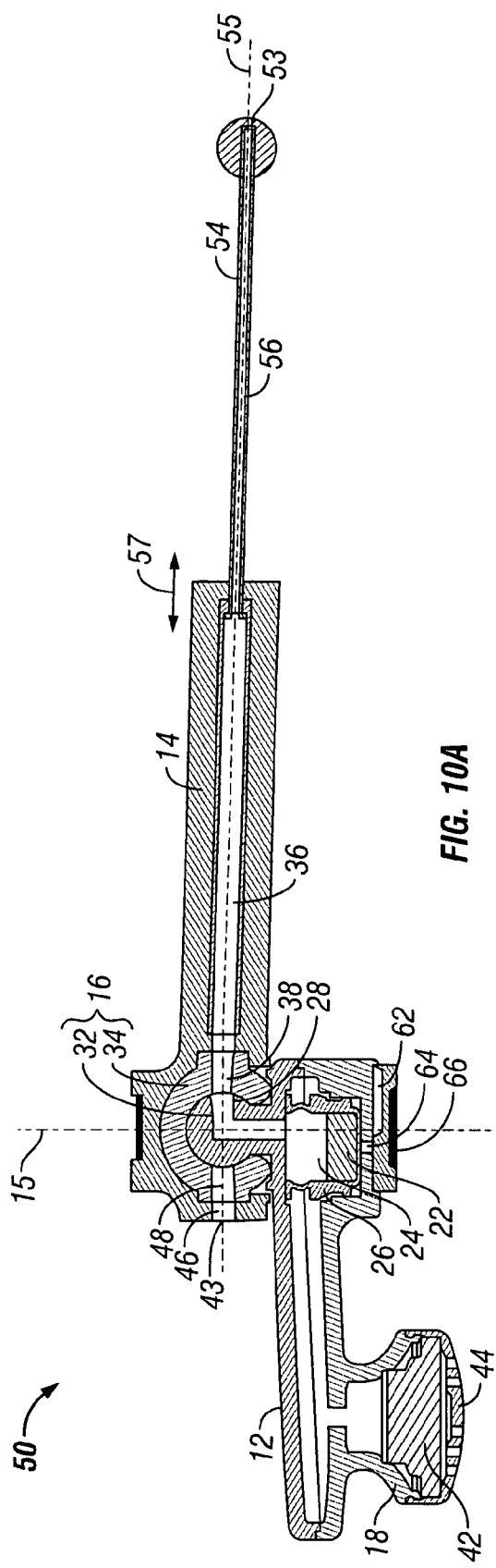
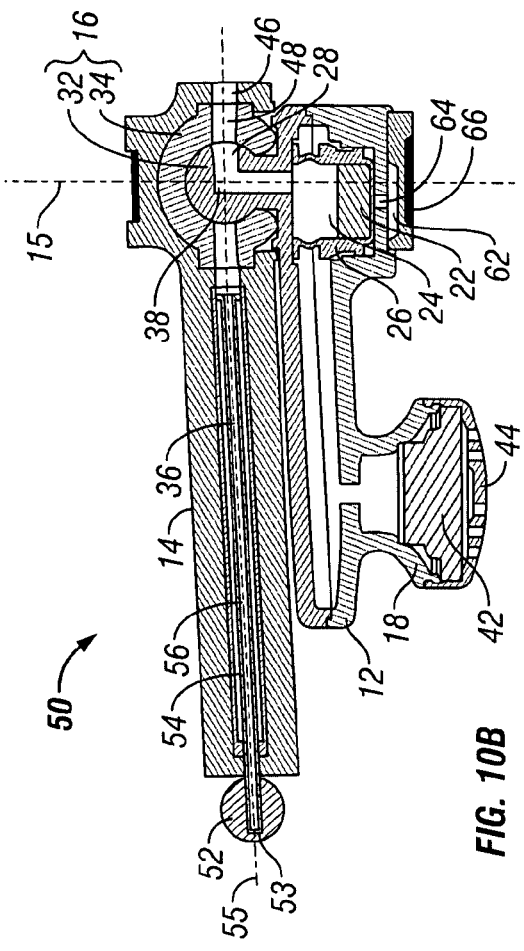
FIG. 10A
FIG. 10B

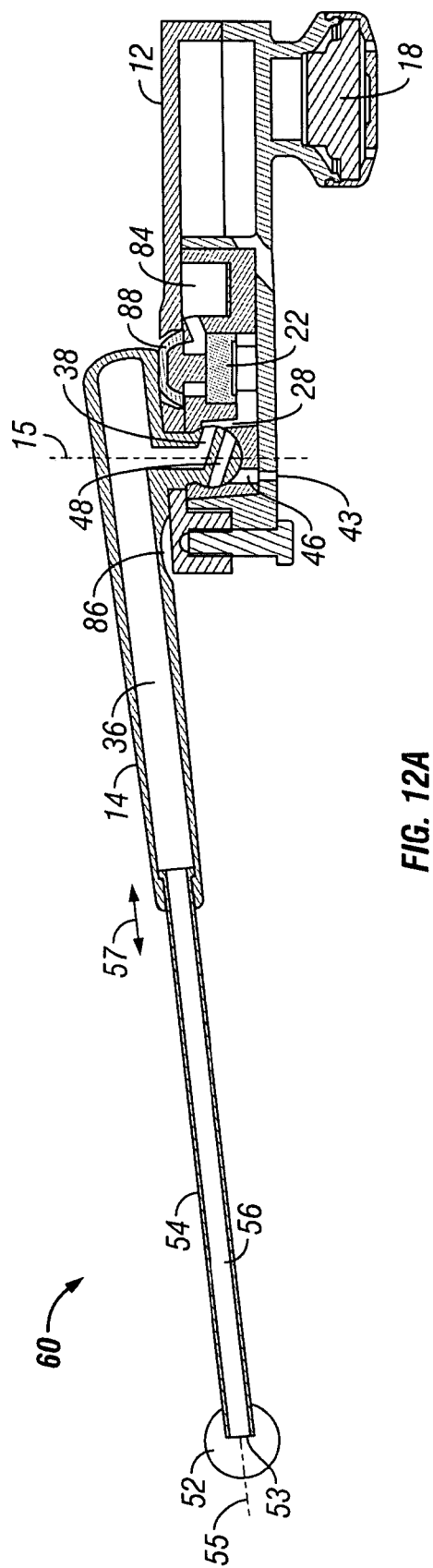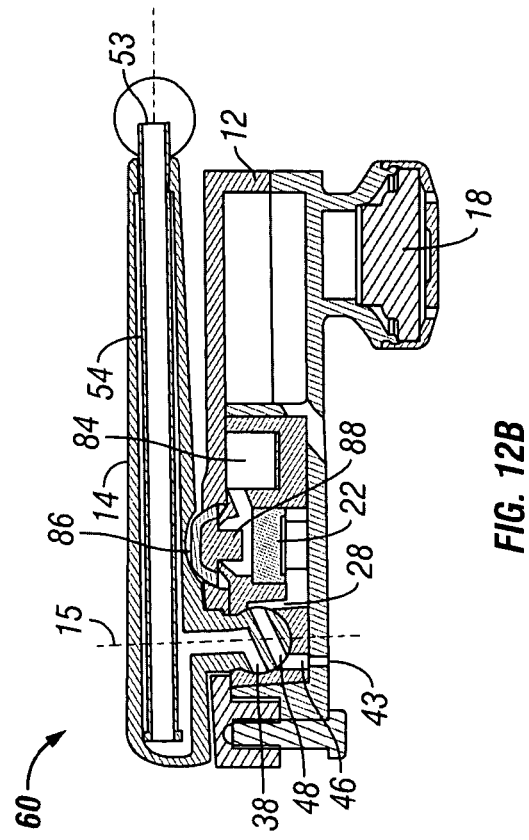
FIG. 12A
FIG. 12B

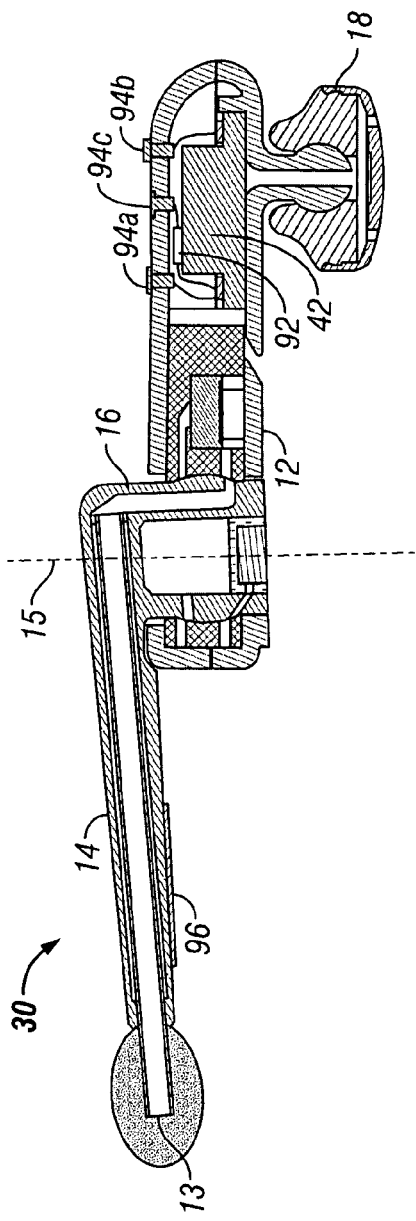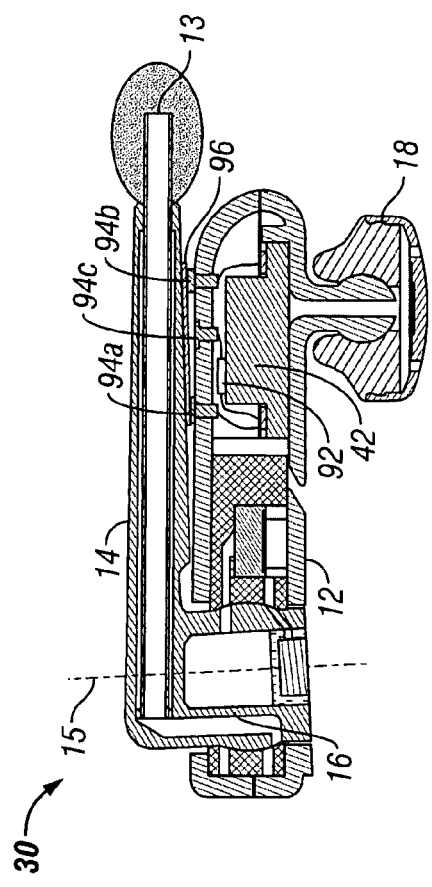
FIG. 13A
FIG. 13B

NOISE MASKING COMMUNICATIONS APPARATUS

TECHNICAL FIELD

This invention relates generally to sound sensing devices, and more particularly to headsets that utilize a movable boom.

BACKGROUND

Communications headsets can be used in a diversity of applications, and are particularly effective for use with mobile communications devices such as cellular telephones. The use of communications headsets with mobile communications devices depends heavily on the headsets' ability to provide consistently high transmit signal quality, of which one important measure is the signal-to-noise ratio (i.e. ratio between the amount of signals associated with the desired acoustic source such as the user's mouth and those from ambient noise). Hence, it is desirable for communications headsets to include certain mechanisms that provide a high signal-to-noise ratio when the headsets are used in noisy environments. It is particularly advantageous to be able to reduce the obscuring effect of ambient noise in the transmit signals when the headsets are used outdoors.

Previous noise reduction designs often involve complicated electrical circuitry, which are both delicate and prone to errors. For example, noise-canceling microphones, i.e., microphones that are more sensitive to sound waves approaching in certain directions relative to the others, have been designed for use in noisy environments. These microphones are constructed such that both sides of their diaphragms are exposed to sound waves, and reduce the noise content of the transmit signals, thereby increasing the signal-to-noise ratio. Another class of solutions involves the use of sophisticated signal processing techniques to reduce the level of noise content in the transmit signals. Both types of solutions have their deficiencies.

Noise-canceling microphones are typically placed at the end of a long boom so that it can be aimed at to the user's mouth. When used in a noisy environment, a noise-canceling microphone can increase the signal-to-noise ratio of the output signals for two reasons. First, provided the microphone is positioned to aim at the user's mouth, sound waves from the user's voice approach the microphone in or near the direction of maximum sensitivity. The ambient noise, on the other hand, is usually diffuse and approaches from many different directions. Thus, only a small portion of the noise approaches the microphone in the directions of high sensitivity. Even if the noise source is non-diffuse, i.e., the noise originates from one or a few specific directions, there is a high probability that a large portion of the noise approaches from directions in which the microphone is relatively insensitive. The second reason for the increase in signal-to-noise ratio relates to a phenomenon known as "proximity effect." In essence, the proximity effect relates to directional microphones responding strongly to sound waves from close-by sources. This is because, by virtue of the curvature of the wave fronts of sound originated from a small, close-by source, the amplitude difference between the arrivals of the waves to the front and to the rear of the microphone's diaphragm becomes significant, particularly at low frequencies. The noise-canceling microphone is therefore more sensitive to the user's voice than the ambient noise from faraway sources.

The advantages of a noise-canceling microphone can only be realized if the acoustic sensing point is close to the user's mouth and appropriately positioned (e.g., in front of rather than behind the cheek bone). To satisfy these conditions generally requires a sufficiently long boom that provides the user with enough flexibility to aim the microphone towards the user's mouth. In addition, the superior performance of a noise-canceling microphone depends largely on the assumption that the noise is diffuse or that it approaches from an angle outside the maximum sensitivity range of angles associated with the microphone, which is not always valid. Moreover, noise-canceling microphones are known to be more susceptible to wind noise than omni-directional microphone because of the turbulence in pressure resulting from wind blowing on the microphone. In fact, as the directivity factor of a noise-canceling microphone is increased, so does the ratio of wind noise sensitivity to voice sensitivity.

Long booms, which place the acoustic sensing point near the user's mouth, as required for effective noise canceling, are not always desirable in communications headsets. Headsets with short booms or no booms at all are sometimes appealing because of their unobtrusive and stylish appearance and easy stowability. This is particularly true to users of portable communication applications such as mobile phones. It is therefore desirable that communications headsets can be designed with multiple modes of operation, including at least a mode featuring a long boom extending near the user's mouth to communicate in noisy environments, and a compact mode that provides convenience when noise is not a problem.

There are other ways to reduce the undesirable effect of ambient noise in the transmit signals that employ signal processing techniques. One such technique is voice expansion, which is a form of dynamic signal processing that dynamically adjusts the amplification gain (i.e., the ratio between the levels of the amplified output signals and the raw electrical signals as converted by the microphone from acoustic signals before the amplification) as a function of the transmit signal level. Hence, when a communications headset equipped with a voice expansion mechanism is used in a noisy environment, voice expansion serves to reduce the level of output signals, including both the signals originating from the desired source and the ambient noise, when the signal level is low.

A related problem with allowing conventional communications headsets to operate in multiple modes with different boom lengths is that of sound distortion in the audio transmission. The limited dynamic range of telephone lines may result in distortion in the transmission. In addition, noise-canceling microphones have different frequency response curves for differently distanced acoustic sources due to the proximity effect. Further, even if an omni-directional microphone is used, there may still be a shift in the sound spectrum associated with any change in the location of the acoustic sensing point relative to the user's mouth. This is because high frequencies are attenuated more than low frequencies when the sound is traveling in the air.

Accordingly, it is desirable to provide a communications headset that operates in multiple modes in different boom lengths with a mechanism to adjust for optimal voice sensitivity in each mode, which is simple and inexpensive to implement.

SUMMARY OF THE INVENTION

The present invention overcomes the limitations of conventional communications headset design by providing a communications headset with multiple modes of operation, at least one of the modes including the placement of the voice sensing point close to the user's mouth.

According to one aspect of the present invention, an apparatus capable of providing an output signal in response to sound pressure in the vicinity of a desired source operates in multiple modes corresponding to different positions of a movable boom, such that the ratio of the amplitude of the output signal to the amplitude of sound pressure in the vicinity of the desired source remains substantially independent of the operating mode. This is accomplished by changing the ratio of the amplitude of the output signal to the amplitude of sound pressure at the acoustic sensing point in response to the position of the boom. In at least one of the multiple modes of operation, sound waves are received at an acoustic sensing point close to the desired acoustic source, thus enabling a high signal-to-noise ratio in the audio transmission. In a communications headset application of this aspect of the invention, the headset comprises a microphone and a boom, movably coupled to a main body and adapted to be positioned in various positions, and is adapted to receive acoustic signals through the acoustic sensing point located at an opening on the boom. A noise masking mechanism is activated to reduce the ratio of the amplitude of the output signal to that of the sound pressure at the sensing point in at least one operating mode of the apparatus, by placing the acoustic sensing point relatively close to the desired sound source. Since the ambient noise is masked by the user's voice in this mode of operation, this reduction in the headset's sensitivity effectively lowers the transmitted level of ambient noise without changing the transmitted level of the user's voice. In one embodiment of this aspect of the invention, a directional microphone is employed in conjunction with one or more enclosed acoustic cavities to which the microphone's diaphragm is selectively, acoustically coupled, where the volume of the cavities is adjusted as a result of the boom's position. Yet another embodiment includes acoustic channels in the body of the boom that are variously shaped, sized or built to induce different levels of transmission loss. In a third embodiment of this aspect of the invention, a switch coupled to the boom controls a circuit that changes either the microphone bias or the amplification gain applied to the microphone signal.

The movable boom in accordance with the present invention also enables the implementation of frequency compensation mechanism. A communications headset that includes transmit frequency compensation comprises a frequency response compensation circuit, electrically coupled to the microphone, adapted to compensate for shifts in input frequency spectrum as a function of the distance between the acoustic sensing point and the source, and/or for shifts in the frequency response of a noise-canceling microphone as a function of the distance between the microphone and the source.

A headset built according to this aspect of the invention may be underutilized. For example, an inexperienced user may keep the headset in the folded-boom mode even in noisy environments, unless the person at the opposite end of the communication line complains about noise. Therefore, according to a second aspect of the present invention, the receive sensitivity (i.e. the ratio of the amplitude of the acoustic signals output by the receiver to the amplitude of the corresponding electrical signals received from the remote user) is reduced when the headset operates in a mode that places the acoustic sensing point relatively far away from the user's mouth. Thus, the user will choose this mode only in a sufficiently quiet environment. This aspect of the invention allows the receive sensitivity to be high enough to be used in a noisy environment, yet low enough to avoid "squealing" when the headset operates in a mode that places the acoustic sensing point relatively close to the receiver. In addition, this aspect of the invention minimizes the level of the speech echo that is audible to the remote user if the line has a noticeable signal delay, such as packet delay that is common in digital telecommunications. When both aspects of the invention are employed, the sum of Transmit Loudness Rating (TLR) and Send Loudness Rating (SLR) can be maintained at the highest level possible without squealing or echo problems in multiple modes of operation.

Additional advantages of the invention will be set forth in part in the description which follows and in part will be apparent from the description or may be learned by practice of the invention. The objects and advantages of the invention will be realized and attained by means of the elements and combinations particularly pointed out in the appended claims and equivalents.

BRIEF DESCRIPTION OF THE DRAWINGS

FIGS. 4(a), (b) and (c) are schematic drawings illustrating the arrangement of various elements of the headset of FIG. 4 when it is operating in different modes.

FIGS. 10(a) and (b) are cross-section views of the headset shown in FIG. 6 in the doubly extended and compact modes of operation, respectively.

FIGS. 12(a) and (b) are cross-section views of still another headset in accordance with the present invention in the doubly extended and compact modes of operation, respectively.

FIGS. 13(a) and (b) are cross-section views of still another headset in accordance with the present invention that adjusts the receive gain in response to the position of the boom.

Figure 1:
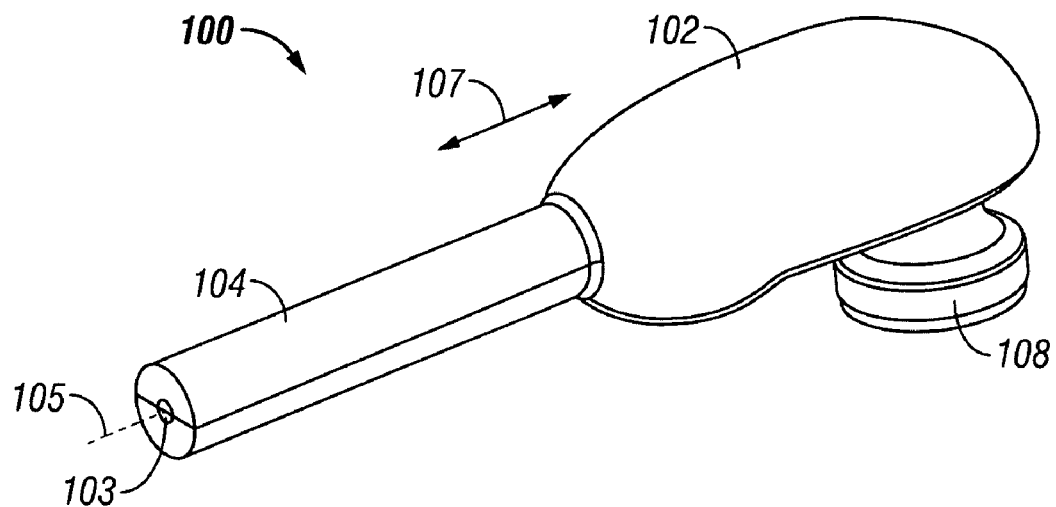
FIG. 1 is a perspective view of a headset in accordance with the present invention, illustrating the slidable boom in an extended position.

The figures depict preferred embodiments of the present invention for purposes of illustration only. One skilled in the art will readily recognize from the following discussion that alternative embodiments of the structures and methods illustrated herein may be employed without departing from the principles of the invention described herein.

DETAILED DESCRIPTION OF THE PREFERRED EMBODIMENTS

A communications headset design utilizing a movable boom to enable a noise masking mechanism is described below. In the following description, for purposes of explanation, numerous specific details are set forth in order to provide a thorough understanding of the invention. The art of headset design and acoustic engineering are such that many different variations of the illustrated and described features of the invention are possible. Those skilled in the art will undoubtedly appreciate that the invention can be practiced without some specific details described below, and indeed will see that other variations and embodiments of the invention can be practiced while still satisfying the teachings of the invention.

According to one aspect of the present invention, a communications headset can operate in multiple modes corresponding to different positions of a movable boom that disposes the acoustic sensing point at different distances from a desired sound source and still provides a voice sensitivity (ratio of the amplitude of the output signals to the amplitude of the sound pressure at the vicinity of the user's mouth) that is substantially independent of the mode it is operating in. In at least one of the multiple modes of operation, sound waves are received close to the desired acoustic source, enabling a high signal-to-noise ratio in the audio transmission. According to this aspect of the present invention, a "noise masking" mechanism may be activated in the high signal-to-noise operating mode of the headset to reduce the sensitivity of the headset to ambient noise. Since the noise content at the acoustic sensing point is low relative to the desired signals in this mode of operation (i.e., the noise is masked by the voice), a reduction in sensitivity to sound pressure at the sensing point, together with a corresponding reduction in the distance between the sensing point and the user's mouth, effectively combine to reduce the noise in the transmitted signal without changing the headset's voice sensitivity. In the following, the first aspect of the present invention is first discussed with respect to several exemplary embodiments. The structures of the described embodiments are then referenced in the discussion of the second aspect of the invention. Three types of noise masking mechanisms will be described in detail, based respectively on electrical, mechanical and acoustic means. Further aspects of the present invention are discussed at the end.

Communication Headsets with Multiple Modes of Operation Corresponding to Multiple Boom Positions According to a first aspect of the present invention, the needs for compactness and for satisfactory output signal quality can be achieved in communications headsets that can operate in multiple modes. For example, there can be a compact mode that allows for stowability and style, as well as an extended mode that provides a relatively high signal-to-noise ratio, by virtue of the extended boom placing the acoustic sensing point relatively close to the user's mouth. The term "acoustic sensing point" is used herein to refer to the point (or more generally, location) in space where a headset collects sound waves. For example, the acoustic sensing point of a headset with a long boom may be located at an opening at the distal end of the boom. Hence, the user can select the extended mode when loud noise from wind or other undesirable sources could obscure the user's voice if the acoustic sensing point is disposed further away. As will be discussed below, noise masking mechanism can also be implemented in the extended mode of operation.

One implementation of the concept of multiple mode communications headsets is illustrated in FIG. 1, where there is shown a headset 100 in accordance with the present invention. Headset 100 has a slidable boom 104 that is adapted to telescopically extend or retract with respect to an elongated main body 102 along the boom axis 105, as indicated by arrow 107. The positioning of the boom 104 is facilitated by the provision of a knob 106. Sound waves are received at an opening 103 at the distal end of the boom 104 which functions as the acoustic sensing point. A microphone (not shown in FIG. 1) can either be enclosed in the main body 102 or placed right next to opening 103. In the first case, the boom 104 includes a sound tube that conveys the sound waves to the microphone. In the second case, the microphone and its attached electrical wirings move together with the boom 104.

Also shown in FIG. 1 is an earpiece 108 near one end of the main body 102, with a generally pill-shaped configuration and preferably having a foam covering. The earpiece 108 is designed both as a mounting device that enables a user to wear the headset 100, and as an encasement for an receiver element (not explicitly shown in FIG. 1). It will be readily apparent to one skilled in the art that alternative configurations and sizes of earpiece may be provided with the headset 100. Depending on headset type, the earpiece 18 may be positioned inside the concha (i.e. the cavity surrounding the opening to the ear canal) of the user's ear (intra-concha headset), it may rest against the pinna (supraaural headset) or it may surround the pinna (circumaural headset). FIG. 1 illustrates an intra-concha headset, as an example.

Figure 2A:
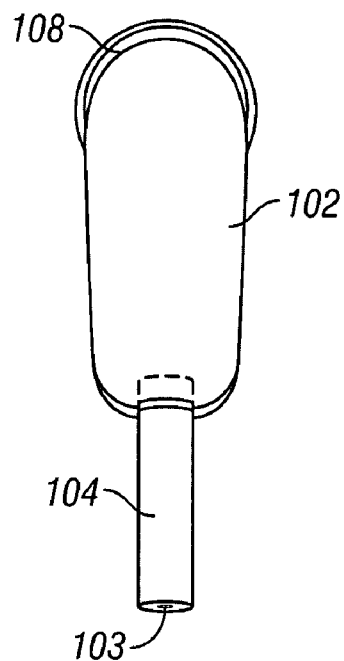
FIGS. 2(a), (b) and (c) are schematic drawings illustrating the arrangement of various elements of the headset of FIG. 1 when it is operating in different modes.
Figure 2B:
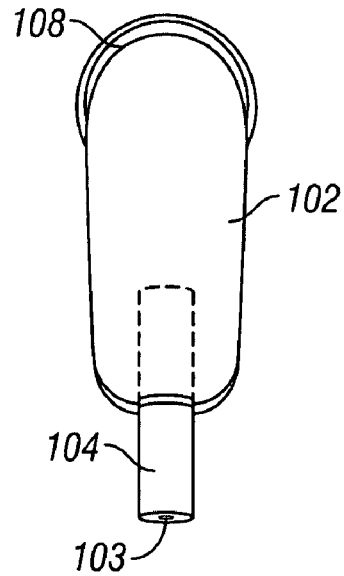

Communications headset 100 has at least two modes of operations. FIG. 2(a) is a schematic illustration of a first, extended mode of operation with the slidable boom 104 fully extended. FIG. 2(b) also illustrates the extended mode, albeit the boom 104 in this case is only half extended. When the headset 100 is used in the extended mode of operation, the acoustic sensing point, located at opening 103, can be disposed relative close to the desired acoustic source, typically the user's mouth. This mode therefore corresponds to a high signal-to-noise ratio and is suitable for the implementation of the noise masking mechanisms discussed in detail below.

Figure 2C:
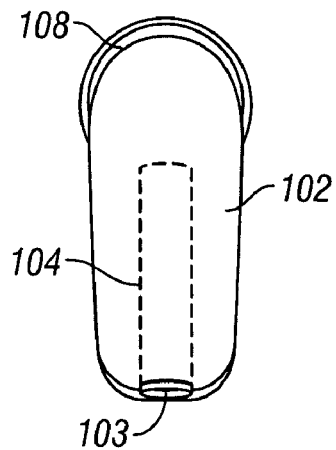

FIG. 2(c) illustrates a second, compact mode of operation of headset 100. In this mode of operation, the boom 104 is fully retracted and is hidden inside the main body 102. The acoustic sensing point, still located at opening 103, is therefore disposed at the end of the elongated main body 102, and far away from the desired acoustic source. The signal-to-noise ratio of the headset 100 in this compact operating mode is typically lower than that in the extended mode, since the acoustic sensing point is restricted to a location near the user's ear and further away from the user's mouth.

Figure 3:
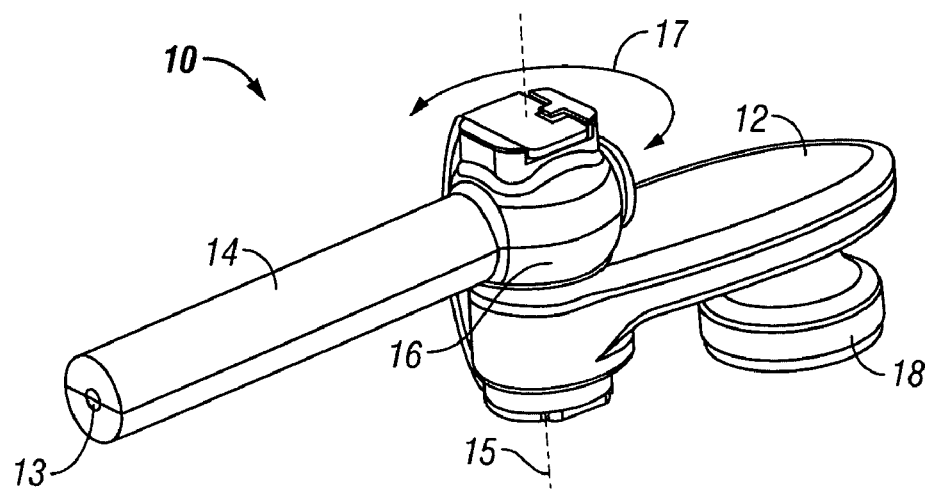
FIG. 3 is a perspective view of another headset in accordance with the present invention, illustrating the foldable boom in an extended position.

Referring to FIG. 3, there is illustrated another embodiment of a communications headset 10 in accordance with the present invention. Headset 10 includes an elongated main body 12 coupled to earpiece 18. An adjustable boom 14 is movably coupled to the main body 12 at a pivoting hinge 16, the structure of which will be further elaborated below. An axis 15 at the centerline of the hinge 16 passes through the main body 12 and the boom 14. Hinge 16 facilitates angular pivoting movement of boom 14 with respect to the main body 12 about the axis 15, as indicated by the arrow 17. This freedom to rotate enables the boom 14 to be positioned at a wide range of angles relative to the main body 12.

FIG. 3 illustrates the extended mode of operation. As noted above, boom 14 has an opening 13 at its distal end which functions as the acoustic sensing point in this operating mode. Hence, sound waves are received by the headset 10 through the opening 13. It will be readily apparent to those skilled in the art that, in other embodiments of the present invention, the acoustic sensing point is not restricted to be located on the boom 14, but can be located at various different locations as long as it serves as an entrance through which sound waves can reach the microphone.

In headset 10, when the boom 14 is disposed at certain predetermined positions or range of positions, the microphone is acoustically coupled to predetermined locations on the headset 10 functioning as the acoustic sensing point, details of which will be further discussed below. Hence, the communications headset 10 has multiple operating modes, each corresponding to a different position or range of positions of the boom 14. At a minimum, these operating modes include an extended mode in which the boom 14 is unfolded as shown schematically in FIG. 4(a), and a compact mode when the boom 14 is rotated to a position directly on top of the main body 12, as shown in FIG. 4(b). Since the schematic illustrations in FIG. 4 are provided primarily to show the different arrangement of the relevant elements of headset 10 when it is operating in different modes, many details of the headset 10 are left out. However, the schematic diagrams include the location of the acoustic sensing point, which is shown to have moved from a first opening 13 on the boom 14 in FIG. 4(a) to a second opening 43 of the boom 14 in FIG. 4(b). In certain embodiments of the present invention, there may be intermediate positions of boom 14 that correspond to additional modes of operation. FIG. 4(c) illustrates one such intermediate boom position.

As in headset 100, the microphone can be disposed either in the main body 12 or in the microphone boom 14. Unlike the case with headset 100, however, the acoustic sensing point of headset 10 moves from one opening at one end of the boom 14 to another opening at the other end of the boom 14 when the headset 10 changes its operating mode, so as to always locate the acoustic sensing point close to the user's mouth. Thus, if it is desired that the microphone be disposed near the acoustic sensing point, two microphones may be needed for use in the two modes of operation. If a single microphone is used, there need to be an acoustic valve which is capable of engaging a different acoustic channel in each mode in order to couple the single microphone to the acoustic sensing point. The acoustic valve is described in more detail below.

Figure 5A:
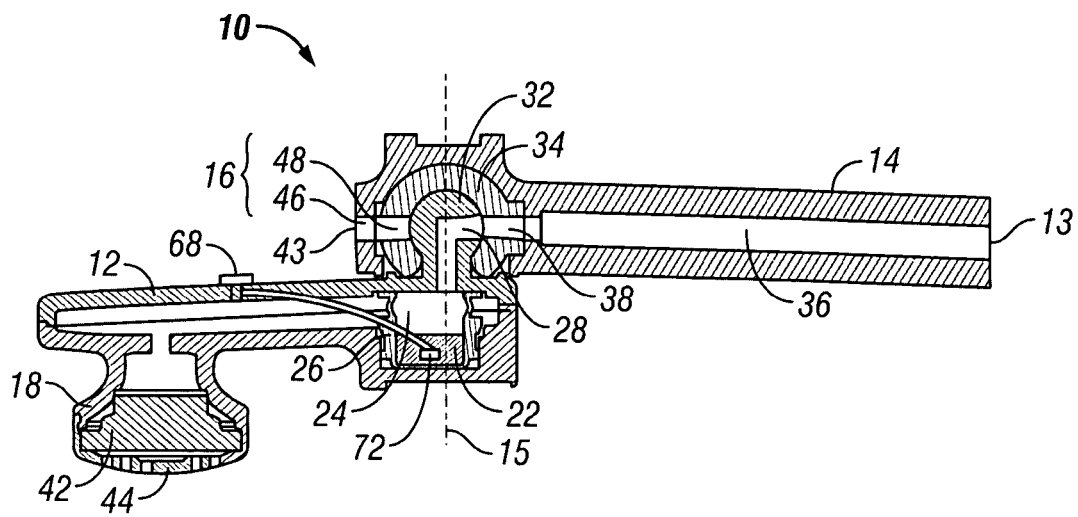
FIGS. 5(a) and (b) are cross-section views of the headset shown in FIG. 3 in the extended and compact modes of operation, respectively.

Referring to FIG. 5(a), there is shown a cross-sectional view of a single microphone embodiment of headset 10 taken at the vertical mid-plane. Main body 12 is shown to encapsulate various electrical, acoustic, and mechanical components at its right end, including a microphone 22 and an adjacent acoustic cavity 24, both encased in a microphone boot 26. Above the acoustic cavity 24 is the ball-and-socket pivoting hinge 16, consisting of a pivot ball 32 and a pivot socket 34, the latter adapted to rotate freely relative to the former about axis 15. As the socket 34 rotates about axis 15, the boom 14 pivots about axis 15. The boom 14 encases a sound tube 36 that terminates in an opening 13 which functions as the acoustic sensing point in the extended mode of operation, as discussed above. It will be readily apparent to those skilled in the art that the pivoting hinge 16 may take other forms, such as a cylindrical pin-and-tube arrangement, as will be discussed below.

According to one aspect of the present invention, sound is collected at the acoustic sensing point from a desired acoustic source. The term "desired acoustic source," as used herein, refers to the location from where the user generates the sound signals to be transmitted, and is generally presumed to lie away from the main body 12 of the headset 10 in the direction of the unfolded boom. Typically the desired acoustic source is the user's mouth, and the communications headset 10 is preferably designed and dimensioned to account for an approximate distance between the typical user's mouth and his left or right ear, wherein the earpiece 18 will be disposed when the headset 10 is in use. With the microphone 22 enclosed in the main body 12, sound from the desired acoustic source can be conducted through various acoustic channels to the microphone 22, the channel utilized depending on the mode the headset 10 is operating in, that is, the position of the boom 14. An "acoustic channel" is simply a path of transmission of sound waves that may include one or more sound tubes, by way of example. In the embodiment depicted in FIG. 5(a), the active acoustic channel comprises the sound tube 36, a short link tube 38 in pivot socket 34, and a bent link tube 28 in pivot ball 32. These various channels 36, 38, and 28 together acoustically couple the acoustic sensing point at opening 13 to the microphone 22 and the associated acoustic cavity 24. On the other end of boom 14, there is shown in FIG. 5(a) a second, relatively short, sound tube 46. This second sound tube 46 terminates on one end in a second opening 43, and connects on the opposite end to a second link tube 48 in the pivot socket 34. These acoustic elements provide an alternative sound reception mechanism for headset 10 operating in a different mode. Thus, the pivoting hinge 16, together with its various link tubes, functions as an acoustic valve, as further discussed below. It should be noted that the acoustic pressure from the user's voice will be higher at point 13 in FIG. 5(a) than at point 43 in FIG. 5(b), whereas the acoustic pressure from an ambient noise source is expected to be at essentially the same level at both points, due to the presumed large distance between the ambient noise source and the headset. Persons trained in the art will recognize however that after reaching the sensing point, all sound waves propagate to the microphone essentially without a loss in acoustic intensity, due to plane-wave conditions within sound tube 36.

Figure 5B:
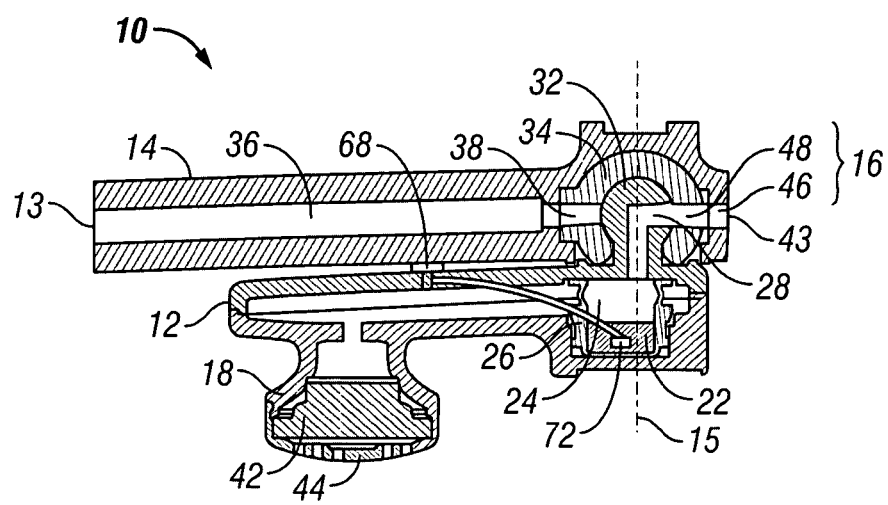

Referring to FIG. 5(b), there is shown a second cross-sectional view of the communications headset 10 taken at the vertical mid-plane. The headset 10 is depicted here in the compact mode of operation, with the boom 14 placed directly on top of the main body 12, corresponding to the case schematically illustrated in FIG. 4(b). In this mode of operation, the acoustic valve 16 acoustically couples the microphone 22 to opening 43, which is now functioning as the acoustic sensing point. Thus, sound from the desired acoustic source is collected at the opening 43 and conducted to the microphone 22 through an alternative acoustic channel comprising the short sound tube 46, the link tube 48 in pivot socket 34, the bent link tube 28 in pivot ball 32 and the acoustic cavity 24. The shifting of the active acoustic sensing point from opening 13 to opening 43 is made possible by the inclusion of two link tubes 38, 48 in the pivot socket 34 on opposite sides of the pivot ball 32. Hence, when boom 14 is positioned as shown in FIGS. 3 and 5(a), the bent link tube 28 in the pivot ball 32 is acoustically coupled to the link tube 38. When the boom 14 is repositioned, as shown in FIG. 5(b), such that the headset 10 operates in the compact mode, the socket moves with the boom in such a way that the link tube 48 instead of tube 38 becomes acoustically coupled to the bent link tube 28, when the latter remains substantially fixed relative to the main body 12. It is this mechanism of activating an appropriate acoustic channel in response the boom's position that enables the pivoting hinge 16 to function as an acoustic valve.

Figure 6:
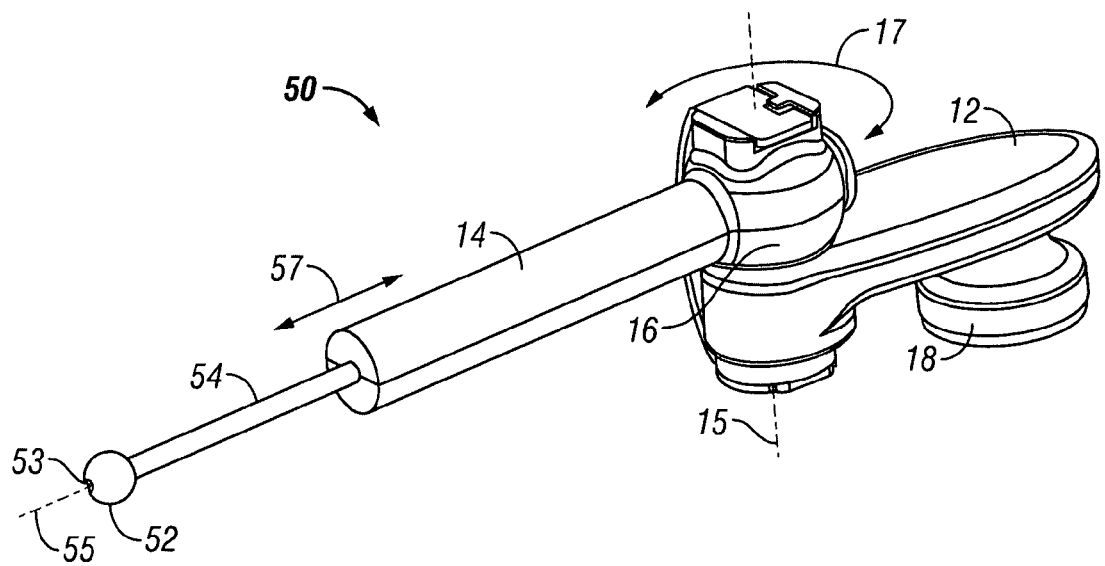
FIG. 6 is a perspective view of yet another headset in accordance with the present invention, illustrating a sliding inner boom in an extended position.

Referring now to FIG. 6, there is illustrated a communications headset 50 according to yet another embodiment of the present invention. Some of the features of the headsets 100 and 10 described above are combined in headset 50. Headset 50 shares some basic features with headset 10, including the main body 12 coupled to earpiece 18, and the movable boom 14 pivoting at hinge 16. Additionally, a secondary, inner boom 54 is slidably engaged with boom 14, enabling it to be telescopically extended or retracted with respect to boom 14 along the boom axis 55, as indicated by arrow 57. The positioning the secondary boom 54 is facilitated by the provision of a knob 52. Analogous to opening 103 of the headset 10 illustrated in FIG. 3, opening 53 at the end of the inner boom 54 functions as the acoustic sensing point. In the fully retracted position, the secondary boom 54 is preferably nestled within boom 14, in direct analogy with slidable boom 104 of headset 100.

Figure 7A:
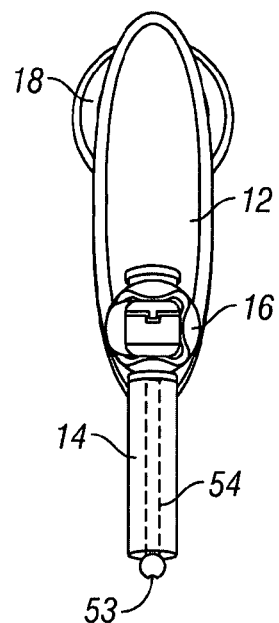
FIGS. 7(a), (b) and (c) are schematic drawings illustrating the arrangement of various elements of the headset of FIG. 5 when it is operating in different modes.
Figure 7B:
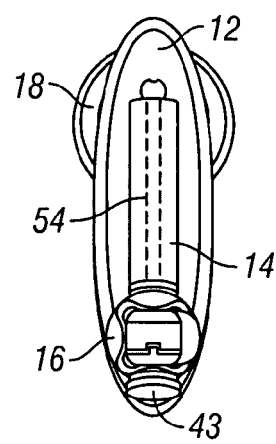
Figure 7C:
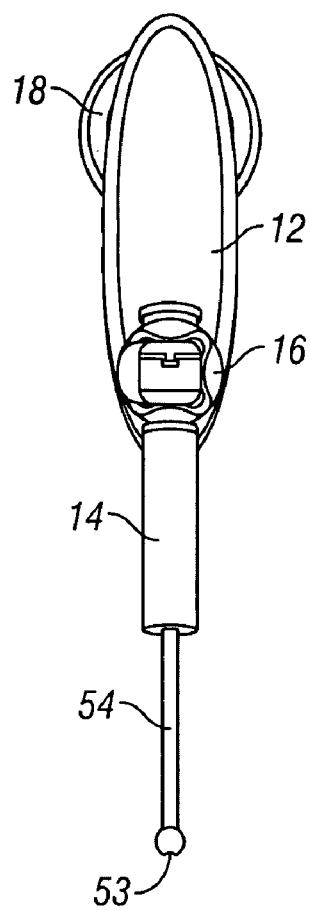

Headset 50 has at least three modes of operation, as illustrated schematically in FIG. 7. As in FIGS. 2 and 4, FIG. 7 shows only the elements of the communications headset 50 relevant for the illustration of the different modes of operation. The extended and compact operating modes of headset 50, as illustrated in FIGS. 7(a) and 6(b) respectively, are analogous to the first two modes of operation of headset 10 shown in FIGS. 4(a) and (b). The only difference is that the acoustic sensing point in the extended mode is located at an opening 53 at the end of a secondary boom 54, as discussed above, instead of an opening 13 (see FIG. 4(a)) at the end of boom 14. The third mode of operation, referred herein as the extended mode, is depicted in FIG. 7(c), as well as in FIG. 6. This operating mode corresponds to having the inner boom 54 telescoping outward, effectively extending the length of boom 14, and placing the acoustic sensing point at opening 53 further away from the main body 12 and earpiece 18 and towards the desired acoustic source. Note that the amount of telescopic extension of the inner boom 54 beyond boom 14 is preferably variable so that the user can adjust the location of the acoustic sensing point as appropriate for the situation.

Figure 8A:
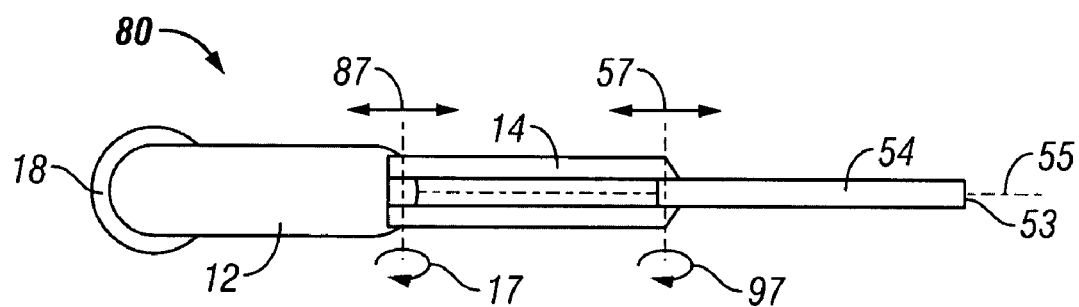
FIGS. 8(a) and (b) are views of another headset in accordance with the present invention in the extended and compact modes of operation, respectively.
Figure 8B:
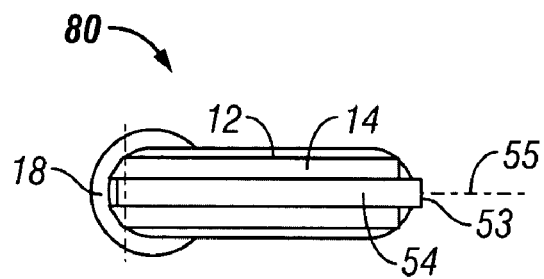
Figure 9A:
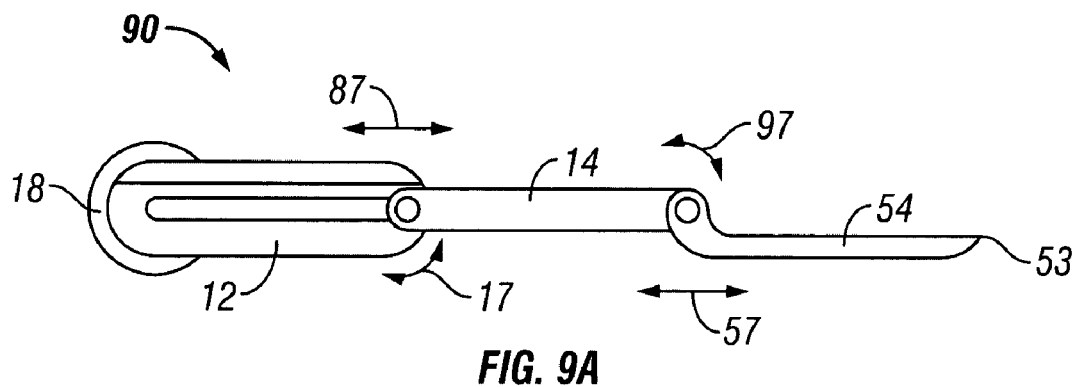
FIGS. 9(a) and (b) are cross-section views of yet another headset in accordance with the present invention in the extended and compact modes of operation, respectively.
Figure 9B:
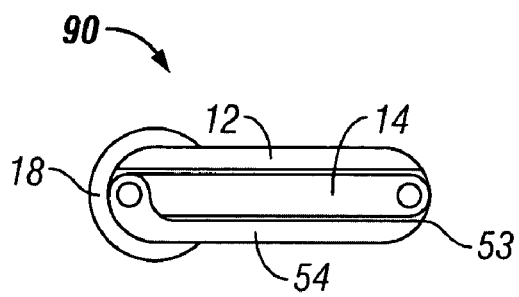

The three headsets 100, 10, and 50 discussed above are but three embodiments of the multiple mode of operation communications headset in accordance with the present invention. It will be apparent to those skilled in the art that many different variations of the above can be practice. For example, the slidable secondary boom 54 in headset 50 can also be used with a slidable primary boom, as illustrated in FIGS. 8(a) and (b). Alternatively, the secondary boom may be coupled with the primary boom using a pivoting hinge, as illustrated in FIGS. 9(a) and (b). As illustrated in FIGS. 8 and 9, the secondary boom 54 may either slide in the direction of arrows 57, or pivot in the direction of arrows 97, with respect to the primary boom 14; likewise, the primary boom 14 may either pivot in the direction of arrows 17 or slide in the direction of arrows 87 with respect to the main body 12.

Referring to FIGS. 8(a) and (b), there is shown a doubly retractable headset 80 in an extended mode and a compact mode, respectively. The headset shares many features with the headsets 100 and 50 described above. It should be readily apparent to those skilled in the art that the schematic illustrations in FIG. 7 apply to headset 80, except that the acoustic sensing point remains at opening 53. It will also be apparent to those skilled in the art that a microphone can either be placed at the distal end of the secondary boom 54, near the opening 53, or in the main body. In the latter case, the primary and second booms 14 and 54 will enclose sound tubes to transmit the sound waves to the microphone.

Referring now to FIGS. 9(a) and (b), there is shown a tri-fold headset 90 in an extended mode and a compact mode, respectively. Like headset 80 described above, the headset 90 shares many features with the previous described headsets, in particular headsets 10 and 50. The schematic of FIGS. 7(b) and (c) can again apply to headset 90, with the understanding that the secondary boom 54 is now folded onto the main body 12 and that the acoustic sensing point remains at opening 53.

Noise Masking Mechanisms Utilizing Electrical Means

The multiple mode design described above provides a partial solution to the problems associated with communicating in noisy environments. While there is an increase in the signal-to-noise ratio when the extended mode is selected, there is no reduction in the level of noise in the transmit signal. Thus, when the headset is used in noisy environments, the high level of noise can become a nuisance or a distraction to the remote user on the receiving end. Moreover, due to the limited dynamic range of telephone lines, using the headset in the extended mode in a noisy environment may lead to excessive distortion in the audio transmission because of the high level of input signals from both the user's voice and the ambient noise. This is particularly true if the headset is designed to operate with little output signal headroom in the compact mode, which may be desirable for the headset to transmit an adequate level of audio signals despite the relatively low overall level of acoustic signals received.

According to one aspect of the present invention, the multiple modes of operation enables the implementation of various noise masking mechanisms in the communications headset 10, 50, 80, 90, or 100 utilizing the movable boom. In one embodiment of the present invention, a noise masking mechanism may be implemented to reduce the headset's transmit sensitivity to sound pressure at the acoustic sensing point when the headset 10, 50, 80, 90, or 100 is operating in a mode with relative high signal-to-noise ratio. The adjustment in the ratio of the amplitude of the output signal to the amplitude of the input acoustic signal (the headset's transmit sensitivity) may be accomplished in a variety of different ways. For example, a mechanism may be implemented to modify the amplification gain applied to the microphone output signal. Alternatively, the mechanism may be adapted to modify the sensitivity of the microphone or the amount of transmission loss when the sound is being conveyed to the microphone. Each type of mechanisms is discussed below.

According to one aspect of the present invention, a noise masking mechanism can be implemented electrically utilizing simple electrical circuitry that modifies the amplification gain applied to the microphone signal. When the microphone 22 receives acoustic signals, it converts them into electrical signals, the amplitude of which depends on the sensitivity of the microphone. The electrical signals are then amplified and become the transmit signals. The ratio of the amplitude of the transmit signal to the amplitude of the electrical signal (as converted by the microphone from acoustic signals) is known as the amplification gain.

In one embodiment according to this aspect of the invention, a transmit controller serves to modify the amplification gain. One way of implementing the transmit controller is by installing a boom-activated switch, such as switch 68 on the main body 12 of the headset 10, which is connected to a controller 72, as illustrated in FIGS. 5(*a*) and (*b*). The controller 72 includes circuitry electrically coupled to the microphone 22 that can change the amplification gain to be applied to the electrical signals converted by the microphone 22 from acoustic signals it receives. Those skilled in the art will recognize that this can be done in a variety of different ways, including for example changing an electrical resistance in the circuit. The switch 68 will be triggered when the boom 14 is in certain positions, such as when it is rotated on top of the main body 12, by way of example. Once triggered, the switch 68 activates the controller circuit to modify the amplification gain. Thus, when the signal-to-noise ratio is high due to the acoustic sensing point being disposed close to the desired acoustic source, as is the case in the extended mode of operation illustrated in FIG. 5(*a*), a small amplification gain is applied. In contrast, in the compact mode of operation as illustrated in FIG. 5(*b*), the boom 14 is rotated on top of main body 12, triggering the switch 68, which in turn activates the transmit controller to increase the amplification gain to compensate for the low sensitivity to sound pressure at the desired sound source. The decrease of the amplification gain when the acoustic sensing point is close to the desired acoustic source results in a reduction of the noise content in the transmitted signal, which is already low relative to the signals from the desired source. Hence, the noise is effectively masked. Note that, although the switch 68 is illustrated only with headset 10 and shown only in FIGS. 5(*a*) and (*b*), the same switch mechanism is equally applicable to headset 50, 80, 90 or 100.

An alternative mechanism uses electrical elements to control the sensitivity of the microphone 22. I If the microphone 22 is of an electret condenser type, its sensitivity depends on the supply voltage and bias resistance. Analogous to the above discussed mechanism to control the amplification gain, a boom-actuated switch 68 (shown in FIGS. 5(*a*) and (*b*)) can be located on the main body 12 such that it will be triggered when the boom 14 is in certain positions, for example, when it is rotated on top of the main body 12. Once triggered, the switch activates the control circuit that modifies either the supply voltage or the bias resistance associated with the electret condenser type microphone 22. Again, although the switch 68 is illustrated only with headset 10 and shown only in FIGS. 5(*a*) and (*b*), the same switch mechanism is equally applicable to headset 50, 80, 90 or 100.

Noise Masking Mechanisms Utilizing Mechanical Means

According to another aspect of the present invention, the sensitivity of the microphone can be mechanically adjusted in response to the boom's position to accomplish noise masking. A mechanical control mechanism is illustrated in FIGS. 10(*a*) and (*b*) for headset 50, although those skilled in the art will readily recognize that the same mechanism can also be used for headset 10. The mechanical control mechanism is made possible with the use of a specific type of microphone that is recognized in the trade as noise canceling, close talking, or directional microphone. This type of microphone is often used in communications headsets for its proximity effect. Proximity effect denotes the fact that this type of microphone is more sensitive to a nearby sound source than it is to distant sources producing the same sound level at the microphone location. As it is readily recognized by those skilled in the art, this type of microphone is provided with sound ports on both sides of the microphone diaphragm, rather than only on one side, as in omni-directional microphones, which are sealed on one side.

It is also readily recognized by those skilled in the art that a capacitive microphone, such as an electret condenser microphone, has a sensitivity that is a function of the effective stiffness of its diaphragm, and the greater the effective stiffness of the diaphragm is, the less sensitive the microphone will be. If the diaphragm is coupled to one or more sealed cavities, the effective stiffness of the diaphragm is the sum of the self-stiffness of the diaphragm and the stiffness of the air springs the diaphragm forms with the acoustic cavities to which it is coupled.

Therefore, according to one embodiment of the present invention, it is possible to use one side of a bi-directional capacitive microphone to pick up sound, and control microphone sensitivity by varying the volume of an acoustic cavity adjoining the opposite side of the microphone. When the volume of a sealed acoustic cavity adjoining a given side of a bi-directional condenser microphone is small, the effective stiffness of the diaphragm is high, thus the sensitivity of the microphone to acoustic pressure at the other side of the diaphragm is low. It should be noted that when a bi-directional microphone is used in this fashion, its effective sound pickup characteristic will be omni-directional, and the microphone will not exhibit the proximity effect.

Referring back to FIG. 10(*a*), there is illustrated that in addition to acoustic cavity 24 above the microphone 22, two additional acoustic cavities 62 and 64 are included below the microphone 22. In this embodiment of the present invention, the microphone 22 is bi-directional. One skilled in the art will recognize that unidirectional or cardioid microphones may also be used, but omni-directional microphones may not be used in this embodiment of the invention. In the arrangement of headset 50 illustrated in FIG. 10(*a*), the cavity 62 is not connected to the other cavities 24 and 64. Also shown is that the microphone 22 adjoins the large cavity 24 above it but is exposed only to the small cavity 64 on the other side. Hence, the microphone 22 is relatively insensitive to the sound input in this arrangement. On the other hand, if the boom 14 is repositioned such that the acoustic cavity 62 becomes acoustically coupled with acoustic cavity 64, as is the case illustrated in FIG. 10(*b*), the total volume of acoustic cavities to which the microphone is exposed underneath it will be larger. Hence, the microphone is more sensitive to sound input when the boom 14 is disposed as shown in FIG. 10(*b*). This increase in microphone sensitivity compensates for the increased distance of the acoustic sensing point from the desired acoustic source when the acoustic sensing point is located at opening 43 in this compact operating mode. In contrast, when headset 50 operates in the extend mode, as shown in FIG. 10(*a*), the acoustic sensing point is located at opening 53, which is extended close to the desired acoustic source. Accordingly, the microphone operates with less sensitivity. Hence, the noise reception by the microphone is reduced.

In the described embodiment, the change in the position of the cavity 62 with respect to microphone 22 and cavity 64 is facilitated by a rotation clip assembly 66. As shown in FIGS. 10(*a*) and (*b*), the clip assembly 66 is adapted to rotate the acoustic cavity 62 around axis 15 in sync with boom 14. As illustrated in FIGS. 10(*a*) and (*b*), the acoustic cavity 62 is enclosed by the main body 12 on the top and the clip assembly 66 on all other sides. It is therefore designed to rotate relative to the main body 12 about axis 15 when the clip assembly 66 rotates about the same axis 15. When the boom is in the folded position as shown in FIG. 10(*b*), the volume of acoustic cavity 62 is added to the volume of acoustic cavity 64, and as a result, the microphone 22 becomes more sensitive to sound pressure in acoustic cavity 24. It will, however, be readily apparent to one skilled in the art that the cavity 62 can be located in a variety of different positions within headset 50, and that many different mechanisms may be utilized to align or re-align the acoustic cavities among each other and with the microphone 22.

Figure 11A:
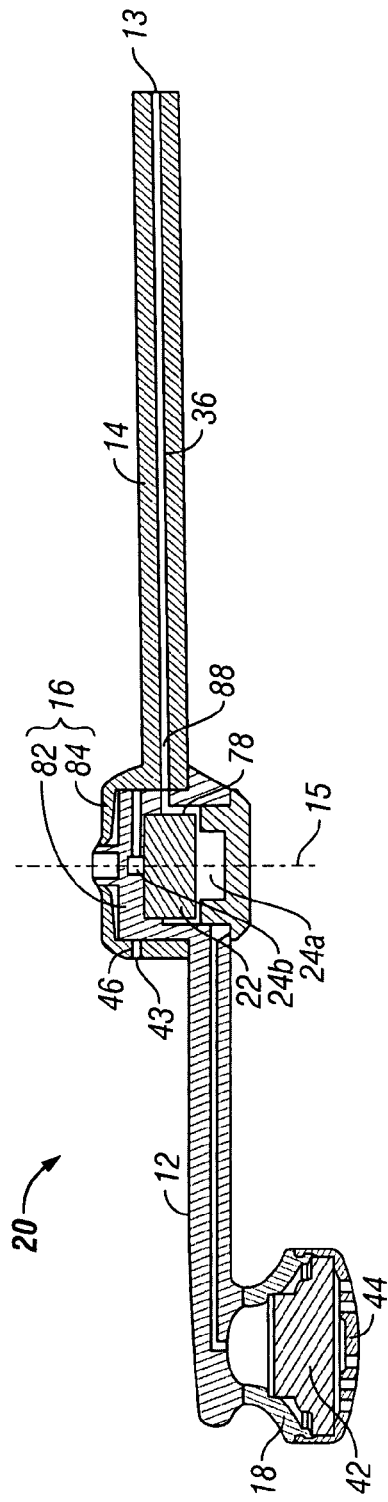
FIGS. 11(a) and (b) are cross-section views of still another headset in accordance with the present invention in the extended and compact modes of operation, respectively.
Figure 11B:
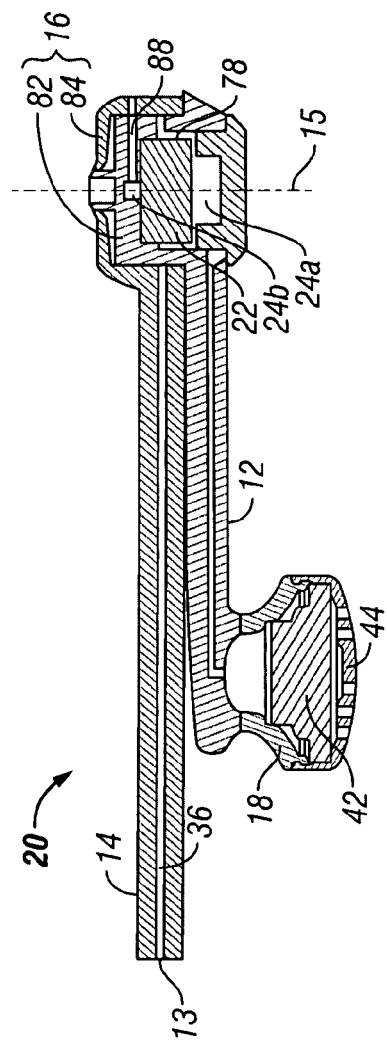

Another embodiment in accordance with this aspect of the present invention is shown in FIGS. 11(a) and (b). There is shown an alternative design of the acoustic valve, in which an electret condenser type bi-directional microphone 22 is sandwiched between two acoustic cavities 24a and 24b, each connected to a link tube 78, 88. As the cylindrical tube forming the valve shell turns with the boom 14, the link tubes 78, 88 are selectively coupled with a sound tube 36, 46 to form an active acoustic channel. The acoustic cavity not coupled becomes a sealed cavity, of which the volume then affects the sensitivity of the microphone as discussed above. Hence, when the headset 20 operates in the extended-boom mode depicted in FIG. 11(a), the acoustic sensing point is disposed close to the desired acoustic source, but the small cavity 24b acoustically coupled to the microphone 22 reduces the microphone sensitivity. Conversely, when headset 20 operates in the compact mode depicted in FIG. 11(b), the acoustic sensing point is disposed further away to the desired acoustic source, but the microphone 22 is now more sensitive because it is acoustically coupled to a larger cavity 24a.

Yet another embodiment according to the mechanical noise masking aspect of the present invention is shown in FIGS. 12(a) and (b). There is shown a folding-retracting headset 60 in the doubly extended mode and the compact mode, respectively. Headset 60 is very similar to headset 50 in design and function, and the schematic illustration of the different modes of operation in FIG. 7 applies equally well to headset 60 as it applies to headset 50. Note, however, that the acoustic sensing point 43 in the compact mode lies on the main body 12 instead of boom 14 for headset 60. The similarity between headsets 50 and 60 ends in the design of the acoustic valve. In headset 60, the microphone 22 is acoustically coupled through the link tube 28 with one of the alternative link tubes 38 and 48, which are in turn acoustically coupled respectively to the sound tubes 36 and 56 in the booms 14 and 54, or to the short sound tube 46 leading to the opening 43 on the main body 12. Thus, opening 43 functions as the acoustic sensing point in the compact mode of operation.

As illustrated in FIGS. 12(a) and (b), the mechanically implemented noise masking mechanism in headset 60 relies on a plunger 88. When the boom 14 is unfolded so that headset 60 operates in the extended or doubly extended mode, the plunger 88 is depressed, decoupling the acoustic cavity 84 from the directional microphone 22. Thus, the sensitivity of the microphone 22 is reduced. In this case the plunger seals off all microphone ports on one side of the diaphragm; the effective acoustic cavity coupled to the diaphragm is internal to the microphone, and not shown. On the other hand, when the boom 14 is folded and the secondary boom 54 retracted inside boom 14, the headset 60 operates in the compact mode and the plunger 88 is not depressed because of the dent 86 included in the boom 14. Hence, the microphone is coupled to acoustic cavity 84. As a result, the sensitivity of the microphone 22 is higher than in the extended operating mode.

Noise Masking Mechanisms Utilizing Acoustic Means

According to yet another aspect of the present invention, acoustic attenuation can be utilized for noise masking purposes. In one embodiment of the present invention, the ratio of the amplitude of the acoustic signals reaching the microphone to the amplitude of the input acoustic signals at the acoustic sensing point can be adjusted by changing the acoustic absorption or impedance mismatch in the acoustic channel acoustically coupling the microphone to the acoustic sensing point, such as the sound tube 36 linking opening 13 on the boom 14 to microphone 22 in the extended mode of operation as illustrated in FIG. 5(a). This is accomplished, for example, by disposing acoustic energy attenuator elements inside or along the wall of the long sound tube 36. Wadding material such as wool yarn can be used for this purpose. Hence, when the headset is operating in an extended mode, the active acoustic channel comprises the long sound tube 36, which includes the acoustic energy attenuator elements that induce transmission loss. The higher transmission loss is, however, balanced with the reduced distance between the acoustic sensing point and the desired sound source. In contrast, when the headset 10, 50 is operating in the compact mode, the distance between the acoustic sensing point and the desired sound source is smaller, but the transmission loss between the acoustic sensing point and the microphone is also lower, since the sound tube 46 is shorter and free of acoustic energy attenuators. As a result, the sensitivity of the headset to the user's voice is substantially unaffected by boom position, whereas its sensitivity to ambient noise is lower when used in the extended-boom mode of operation as depicted in FIG. 5(a). Alternatively, the inner diameter of the tube 36 can be made sufficiently small or be subdivided into a sufficiently large number of parallel small cross-sectioned tubes to induce acoustic resistance. The result is the same as that discussed above, namely, that higher transmission loss is matched with closer distance to the desired acoustic source and vice versa. When a secondary boom is included in the communications headset, such as headset 50 depicted in FIG. 6, the inside bore of boom 14 may be lined with sound absorbing material such as felt or cork, and the secondary boom can be made of materials with little or no transmission loss, such as stainless steel. Thus, the more the secondary boom is extended towards the desired acoustic source, the more transmission loss is built into the active acoustic channel. When the secondary boom is partly extended, the active acoustic channel comprises sound tube 56, part of sound tube 36, link tube 38 and bent link tube 28.

An alternative way to reduce acoustic pressure in the long sound tube 36 is by giving it a reverse exponential horn shaped or similarly tapered waveguide, in which the cross section increases from a small area at the distal end of the boom 14 or secondary boom 54 to a larger area near the microphone 22. Conversely, the short sound tube 46 may be given, for example an exponential horn shape to increase the acoustic pressure at the microphone relative to that at the acoustic sensing point. Thus, when the headset 10, 50 operates in the extended or double-extended mode, the acoustic sensing point is disposed close to the desired acoustic source, but there is a larger transmission loss or acoustic impedance mismatch by virtue of the long sound tube 36 being used. On the other hand, when the headset 10, 50 operates in the compact mode, the desired acoustic source being further away from the acoustic sensing point can be compensated by increasing the acoustic conductivity between the acoustic sensing point and the microphone.

Further Aspects of the Present Invention

According to another aspect of the invention, the spectrum of the user's voice may differ with distance from the user's mouth, and may require appropriate frequency response compensation. when the acoustic sensing point is moved according to the present invention. As discussed above, one possible distortion is associated with the limitation of the microphone's dynamic range. Since the level of acoustic input may differ greatly between the compact and extended modes of operation (used herein to include also the double-extended mode of operation), the microphone in a foldable or slidable headset without the noise masking capability may result in transmit distortion. Either the microphone would be calibrated (with respect to sensitivity and amplification gain) to operate near the maximum of its dynamic range in the extended mode, thereby limiting the output signals in the compact mode to a relatively low level, resulting in noise in the transmit signal, or the microphone would be calibrated to operate with little headroom in the compact mode, thereby creating significant distortion when the headset operates in the extended mode. With the adjustment enabled by the noise masking mechanism according to the present invention, as described above, this problem can be resolved because the microphone operates over the same dynamic range of input levels in both modes of operation.

Another type of distortion arises when a noise-canceling microphone is used. In some embodiments of the present invention such as the communications headset 104 shown in FIG. 1, a noise-canceling microphone can be placed at the distal end of the boom 104 so that it can take advantage of the proximity effect. One aspect of the proximity effect is that the directional noise-canceling microphones respond more strongly to low frequencies. As a result, noise-canceling microphones have different frequency response curves for different distances from the source. To compensate for the potential sound distortion associated with the proximity effect, frequency response compensating circuit can be implemented such that different equalization can be used for different modes of operation. In one embodiment according to this aspect of the present invention, control circuitry such as those discussed above that adjust the amplification gain or the microphone sensitivity can be implemented. For example, a switch similar to switch 68 illustrated in FIGS. 5(a) and (b) can be used to trigger some particular frequency response compensation. The same switch 68 may even be used to adjust the amplification gain and the frequency response compensation at the same time.

The control circuitry described above can also be used to compensate for another type of distortion associated with the variation in the input frequency spectrum of the acoustic signals due to the different distances between the acoustic sensing point and the acoustic source when the headset operates in different modes. This variation in the frequency spectrum is a consequence of the fact that, when sound waves travels in air, high frequencies are attenuated more than low frequencies. Thus, for example, there is more high frequency content in the voice near a user's mouth. In another embodiment in accordance with this aspect of the present invention, the variation in the input frequency content can be compensated by providing additional damping in the acoustic channel when the headset 100, 10, or 50 is used in the extended mode. For example, absorptive material such as wood may be used to line the bore of the outer boom 14 of headset 50 (illustrated in FIG. 10(a)). When the inner boom 54 is extended, more of the damping material is exposed within the acoustic channel. While the acoustic sensing point is located closer to the source thus boosting the high frequencies, the excess damping also tend to damp out the high frequencies, thus compensating for the change in frequency content. It should be noted that the same damping material can also serve the purpose of inducing transmission loss, corresponding to one mechanism to mask ambient noise, as discussed above. Hence, the noise masking and frequency compensation mechanisms can be implemented at the same time. Those skilled in the art will recognize that this remark applies not only to this particular embodiment, but also more generally to many noise masking and frequency compensation mechanisms, whether or not discussed in the above.

According to yet another aspect of the present invention, the receive sensitivity can be changed in response to a change in the operating mode. Referring to FIGS. 13(a) and (b), there is shown a headset 30 with an acoustic valve 16 in accordance with one embodiment of the present invention. When the headset 30 operates in the extended-boom mode depicted in FIG. 13(a), the acoustic sensing point is disposed close to the desired acoustic source. Accordingly, the amplification gain or the microphone sensitivity will be reduced in one of the ways described above. However, in the described embodiment, the receive sensitivity will also be changed. To accomplish this, a receive controller is provided that is capable of changing the ratio of the amplitude of the acoustic signal output by the speaker 42 to the amplitude of electrical input signal the speaker receives (receive sensitivity of the headset). When headset 30 operates in the compact mode as depicted in FIG. 13(b), the headset's receive sensitivity can be reduced To a level that is appropriate for use in a relatively quiet environment.

FIGS. 13(a) and (b) also illustrate two conducting elements 94a and 94b and a resistive element 96, such as a carbon strip, which can be utilized together to selectively modify the resistance in the receive controller circuit. A person skilled in the art will recognize that when the boom 14 is folded, as shown in FIG. 13(b), the resistance of the resistive element 96 will be in parallel with the voice coil resistance of the speaker 42. As a result, if the source impedance is sufficiently high, the signal, which can be applied across the terminals 94a and 94b is attenuated when the boom is folded. Conversely, when the boom 14 is extended as shown in FIG. 13(a), the resistive element 96 is disconnected and the voltage across the speaker terminals will be greater for the same input. With a low impedance source, the receive signal is applied across terminals 94b and 94c, such that in the extended boom mode, resistance 92 operates in series with the voice coil of the speaker. When the boom is folded as shown in FIG. 13(b), the resistive element 96 is inserted in parallel with the speaker, and the voltage across the speaker terminals is attenuated. Those skilled in the art will recognize that it is also possible to mechanically couple a switching mechanism to the boom such that a resistor, which operates in series with the speaker when the boom is folded, is replaced with a conductor when the boom is extended.

Although the invention has been described in considerable detail with reference to certain embodiments, other embodiments are possible. As will be appreciated by those of skill in the art, the invention may be embodied in other specific forms without departing from the essential characteristics thereof. Those skilled in the art will recognize that there are other means of implementing a communications headset that operates in multiple modes and arrangements, with at least a mode of operation that includes a noise masking mechanism. For example, there are other ways to cause control circuits to adjust the microphone amplification gain or microphone sensitivity. Similarly, the volume of coupled acoustic cavities may be changed by a different mechanism than that described, such as the sliding of a slidable boom. Also, the inner boom 54 of headset 50 (as illustrated in FIG. 6) may be utilized to control the various electrical or mechanical means to control the sensitivity of the headset to sound pressure at the acoustic sensing point. Additionally, those skilled in the art will recognize other headset configurations suitable for use with various aspects of the present invention. By way of example, the secondary boom 54 may be coupled to the primary boom 14 by a pivoting mechanism instead of a sliding mechanism. Accordingly, the present invention is intended to embrace all such alternatives, modifications and variations as fall within the spirit and scope of the appended claims and equivalents. It should also be evident that, while communications headsets are used to illustrate the concepts, applications are not limited to headsets or communication devices, but the invention applies generally to devices that provide an electrical output signal in response to acoustic pressure at a particular sound source in the presence of noise, whether or not the noise is of acoustic nature.

The invention claimed is:

1. An apparatus capable of providing an output signal in response to sound pressure in the vicinity of a desired acoustic source, the apparatus comprising:
   a main body located at a given distance from the desired source;
   a boom, movably coupled to the main body and adapted to be positioned in at least a first position or a second position;
   a microphone having a diaphragm;
   an acoustic sensing point, acoustically coupled to the microphone, wherein the acoustic sensing point is disposed at different distances from the desired acoustic source when the boom is in the first position and the second position; and,
   a controller, coupled to the boom, for changing a ratio of an amplitude of the output signal to an amplitude of sound pressure at the acoustic sensing point in response to the position of the boom;
   wherein the controller is adapted to maintain a ratio of the amplitude of the output signal to an amplitude of sound pressure in the vicinity of the desired acoustic source independently of the position of the boom without moving the main body relative to the desired source.

2. The apparatus of claim 1, wherein the controller is adapted to change an amplification gain in response to the position of the boom, wherein the amplification gain is a ratio of the amplitude of the output signal to an amplitude of an electrical signal converted by the microphone from sound pressure at the diaphragm.

3. The apparatus of claim 1, wherein the controller is adapted to change a sensitivity of the microphone in response to the position of the boom, wherein the microphone sensitivity is a ratio of an amplitude of an electrical signal converted by the microphone from sound pressure at the diaphragm to an amplitude of the sound pressure at the diaphragm.

4. The apparatus of claim 3, wherein:
   the microphone is of a capacitive type; and,
   the controller is adapted to change a bias voltage of the microphone.

5. The apparatus of claim 3, wherein:
   the microphone is a directional, capacitive microphone; and,
   the controller is adapted to change a volume of at least one sealed acoustic cavity acoustically coupled to the diaphragm.

6. The apparatus of claim 3, wherein:
   the microphone is of a capacitive type; and,
   the controller is adapted to change a bias resistance of the microphone.

7. The apparatus of claim 1, wherein the controller is adapted to change a ratio of an amplitude of sound pressure at the diaphragm to the amplitude of the sound pressure at the acoustic sensing point in response to the position of the boom.

8. The apparatus of claim 7, wherein the controller is adapted to change an amount of acoustic absorption in an acoustic channel coupling the acoustic sensing point to the microphone diaphragm.

9. The apparatus of claim 7, wherein the controller is adapted to change an amount of impedance mismatch in an acoustic channel coupling the acoustic sensing point to the microphone diaphragm.

10. The apparatus of claim 1, wherein the apparatus is a communications headset.

11. The apparatus of claim 1, wherein the apparatus is a mobile phone.

12. The apparatus of claim 1, wherein the apparatus is a sound recorder.

13. The apparatus of claim 1, wherein the apparatus is a video camera.

14. An apparatus capable of providing an output signal in response to sound pressure in the vicinity of a desired acoustic source, the apparatus comprising:
   a main body;
   a boom, movably coupled to the main body and adapted to be positioned in at least a first position or a second position;
   a microphone having a diaphragm for generating output signals in response to sound pressure from the desired acoustic source;
   an acoustic sensing point, acoustically coupled to the microphone, wherein the acoustic sensing point is disposed at different distances from the desired acoustic source when the boom is in the first position and the second position; and,
   sensitivity control means for changing the sensitivity of the microphone in response to movement of the boom between the first and second positions such that a ratio of the amplitude of the output signal to an amplitude of sound pressure in the vicinity of the desired acoustic source is maintained substantially independently of the position of the boom.

15. The apparatus of claim 14, wherein:
   the microphone is a directional, capacitive microphone; and, the sensitivity control means is adapted to change a volume of at least one sealed acoustic cavity acoustically coupled to the diaphragm.

16. The apparatus of claim 14, wherein the sensitivity control means is adapted to change a ratio of an amplitude of sound pressure at the microphone diaphragm to the amplitude of the sound pressure at the acoustic sensing point in response to movement of the boom between the first and second positions.

17. The apparatus of claim 16, wherein the sensitivity control means is adapted to change an amount of acoustic absorption in an acoustic channel coupling the acoustic sensing point to the microphone diaphragm.

18. The apparatus of claim 16, wherein the sensitivity control means is adapted to change an amount of impedance mismatch in an acoustic channel coupling the acoustic sensing point to the microphone diaphragm.

19. An apparatus capable of providing output signals in response to acoustic signals received from a desired acoustic source, the apparatus comprising:

a main body;

a boom, movably coupled to the main body and adapted to be positioned in at least a first position and a second position relative to the main body, and further having at least a first opening defining an acoustic sensing point for receiving acoustic signals when the boom is in at least one of the first position and the second position;

a microphone having a diaphragm acoustically coupled to the first opening; and, a controller circuit coupled to the boom and operable in response to movement of the boom between the first and second positions to change a ratio of an amplitude of the output signal to an amplitude of the acoustic signal sensed at the microphone diaphragm such that a ratio of the amplitude of the output signal to an amplitude of sound pressure in the vicinity of the desired acoustic source is maintained substantially independently of the position of the boom.

20. The apparatus of claim 19, further comprising:

a switch, coupled to the main body and selectively engaged by the boom, that activates the controller circuit to change the ratio of the amplitude of the output signal to the amplitude of the acoustic signal at the diaphragm in response to the boom being in at least one of the first or second position.

21. The apparatus of claim 19, wherein:

the boom is slidably coupled to the main body so as to be extended from the main body and closer to the desired acoustic source in the first position, and retracted towards the main body in the second position; and, the microphone receives acoustic signals through the first opening located at a distal end of the boom when the boom is in each of the first and second positions.

22. The apparatus of claim 21, wherein;

the main body includes a boom jacket; and, the boom is slidably coupled to the boom jacket.

23. The apparatus of claim 21, wherein:

the controller circuit changes an amplification gain applied to electrical signals converted by the microphone from acoustic signals received, wherein a first amplification gain is applied when the boom is in the first position and a second amplification gain is applied when the boom is in the second position, the first amplification gain being smaller than the second amplification gain.

24. The apparatus of claim 21, wherein:

the controller circuit changes a sensitivity of the microphone to acoustic signals received, wherein the microphone has a first sensitivity when the boom is in the first position and a second sensitivity when the boom is in the second position, the first sensitivity being lower than the second sensitivity.

25. The apparatus of claim 19, wherein:

the boom pivots about the main body; and, the microphone receives acoustic signals through the first opening when the boom is in the first position and through a second opening when the boom is in the second position, the first opening being located at a first distance from the desired acoustic source when the boom is in the first position and the second opening being located at a second distance from the desired acoustic source when the boom is in the second position, wherein the first distance is shorter than the second distance.

26. The apparatus of claim 25, wherein:

the controller circuit changes an amplification gain applied to electrical signals converted by the microphone from acoustic signals received, wherein a first amplification gain is applied when the boom is in the first position and a second amplification gain is applied when the boom is in the second position, the first amplification gain being smaller than the second amplification gain.

27. The apparatus of claim 25, wherein:

the controller circuit changes a sensitivity of the microphone to acoustic signals received, wherein the microphone has a first sensitivity when the boom is in the first position and a second sensitivity when the boom is in the second position, the first sensitivity being lower than the second sensitivity.

28. The apparatus of claim 19, wherein:

the boom comprises at least a first segment and a second segment movably coupled to the first segment, so as to provide the first position wherein the first segment is extended from the main body and the second segment is extended from the first segment, both being extended closer to the desired acoustic source, and to provide the second position wherein the first segment and the second segment are both retracted towards the main body; and, the microphone receives acoustic signals through the first opening located at a distal end of the second segment of the boom when the boom is in each of the first and second positions.

29. The apparatus of claim 28, wherein the first segment of the boom is slidably coupled to the main body.

30. The apparatus of claim 28, wherein the first segment of the boom pivots about the main body.

31. The apparatus of claim 28, wherein the second segment of the boom is slidably coupled to the first segment.

32. The apparatus of claim 28, wherein the second segment of the boom pivots about the first segment.

33. The apparatus of claim 28, wherein:

the controller circuit changes an amplification gain applied to electrical signals converted by the microphone from acoustic signals received, wherein a first amplification gain is applied when the boom is in the first position and a second amplification gain is applied when the boom is in the second position, the first amplification gain being smaller than the second amplification gain.

34. The apparatus of claim 28, wherein:

the controller circuit changes a sensitivity of the microphone to acoustic signals received, wherein the microphone has a first sensitivity when the boom is in the first position and a second sensitivity to acoustic signals received when the boom is in the second position, the first sensitivity being lower than the second sensitivity.

35. The apparatus of claim 19, further comprising:

a frequency response adjustment circuit, electrically coupled to the microphone, adapted to compensate for shifts in frequency spectrum in the acoustic signals received from the desired acoustic source, the frequency spectrum being a function of a distance between an acoustic sensing point and the desired acoustic source.

36. The apparatus of claim 19, wherein the microphone is a noise-canceling microphone and is disposed near the distal end of the boom, the apparatus further comprising:

a frequency response compensation circuit, electrically coupled to the microphone, adapted to compensate for shifts in frequency response to the acoustic signals received from the desired acoustic source, the frequency response being a function of a distance between the noise-canceling microphone and desired acoustic source.

37. The apparatus of claim 19, further comprising:

a receiver, adapted to generate an acoustic output signal in response to receiving an electrical input signal; and, a receive controller circuit, coupled to the boom and operable to change a ratio of an amplitude of the acoustic output signal at the receiver to an amplitude of the electrical input signal at the receiver in response to movement of the boom between the first and second positions.

38. The apparatus of claim 37, wherein:

the acoustic sensing point is closer to the desired acoustic source when the boom is in the first position than when the boom is in the second position; and, the receive controller circuit changes a receive gain applied to electrical signals received at the receiver, wherein a first receive gain is applied when the boom is in the first position and a second receive gain is applied when the boom is in the second position, the first receive gain being greater than the second receive gain.

39. An apparatus capable of providing output signals in response to acoustic signals, including acoustic signals received from a desired acoustic source, the apparatus comprising:

a main body;

a microphone housed in the main body;

a primary boom coupled to the main body;

a secondary boom slidably coupled to the primary boom for movement between first and second positions relative thereto and having an opening at a distal end thereof, the opening being acoustically coupled to the microphone, wherein a ratio of an amplitude of the output signals to an amplitude of the acoustic signals received at the opening of the secondary boom is a function of at least the position of the secondary boom; and, means operable in response to movement of the secondary boom between the first and second positions thereof for maintaining a ratio of the amplitude of the output signal to an amplitude of sound pressure in the vicinity of the desired acoustic source substantially independently of the positions of the secondary boom.

40. The apparatus of claim 39, wherein:

the primary boom is movably coupled to the main body; and, the ratio of the amplitude of the output signal to the amplitude of the received acoustic signal is a function of the positions of both the primary boom and the secondary boom.

41. The apparatus of claim 39, further comprising:

an extendable acoustic channel, acoustically coupling the microphone to the opening at the distal end of the secondary boom, the acoustic channel extending from a point of coupling of the boom with the main body to the distal end of the secondary boom, the extendable acoustic channel being substantially axially in line through the primary boom and the secondary boom, wherein the acoustic channel is associated with a transmission loss that is a function of the length of the acoustic channel.

42. The apparatus of claim 39, wherein the extendable acoustic channel comprises:

a first acoustic channel in the primary boom encased in a first material; and, a second acoustic channel in the secondary boom encased in a second material, the first acoustic channel being of variable length in response to a sliding position of the secondary boom relative to the primary boom.

43. The apparatus of claim 39, wherein the secondary boom comprises a steel tube.

* * * * *